United States Patent
Hernes (10) Patent No.: US 12,250,000 B2
(45) Date of Patent: Mar. 11, 2025

(54) DELAY ELEMENT CIRCUIT FOR RING OSCILLATOR AND STALL DETECTION UTILIZED IN SELF-CLOCKED SAR ADC

(71) Applicant: Disruptive Technologies Research AS, Rådal (NO)

(72) Inventor: Bjornar Hernes, Trondheim (NO)

(73) Assignee: Disruptive Technologies Research AS, Lysaker (NO)

( * ) Notice: Subject to any disclaimer, the term of this patent is extended or adjusted under 35 U.S.C. 154(b) by 0 days.

(21) Appl. No.: 15/400,534

(22) Filed: Jan. 6, 2017

(65) Prior Publication Data

US 2017/0194980 A1    Jul. 6, 2017

Related U.S. Application Data

(60) Provisional application No. 62/275,365, filed on Jan. 6, 2016.

(51) Int. Cl.
| | | |
|---|---|---|
| *H03M 1/12* | (2006.01) | |
| *H03K 3/03* | (2006.01) | |
| *H03M 1/00* | (2006.01) | |
| *H03M 1/46* | (2006.01) | |

(52) U.S. Cl.
CPC .......... *H03M 1/125* (2013.01); *H03K 3/0315* (2013.01); *H03M 1/002* (2013.01); *H03M 1/468* (2013.01)

(58) Field of Classification Search
CPC ........ H03M 1/38; H03M 1/1245; H03M 1/00; H03M 1/12; H03M 1/46
USPC .................................................. 341/155–165
See application file for complete search history.

(56) References Cited

U.S. PATENT DOCUMENTS

| | | | | | |
|---|---|---|---|---|---|
| 6,163,174 | A | * | 12/2000 | Friedman | G11C 7/1078 326/86 |
| 2002/0153525 | A1 | * | 10/2002 | Shibayama | H01L 22/20 257/E21.525 |
| 2004/0119500 | A1 | | 6/2004 | Hazucha | |
| 2006/0001496 | A1 | * | 1/2006 | Abrosimov | H03K 3/0322 331/57 |
| 2009/0206937 | A1 | * | 8/2009 | Luzzi | G06F 7/588 326/121 |
| 2010/0110623 | A1 | * | 5/2010 | Koyama | H01L 27/1248 361/679.01 |
| 2010/0148177 | A1 | * | 6/2010 | Koyama | H01L 27/1222 257/E33.053 |
| 2011/0063147 | A1 | | 3/2011 | Yoshioka | |
| 2011/0102091 | A1 | | 5/2011 | Yeric | |
| 2011/0227774 | A1 | * | 9/2011 | Cho | H03M 1/0678 341/172 |
| 2012/0149830 | A1 | * | 6/2012 | Wu | C08J 5/18 264/2.6 |

(Continued)

OTHER PUBLICATIONS

International Preliminary Report on Patentability (IPRP), PCT/IB2017/000342, Dated Jul. 9, 2019.

*Primary Examiner* — Lam T Mai
(74) *Attorney, Agent, or Firm* — Onyx IP Group (57) ABSTRACT

A self-clocked SAR ADC sensor circuit includes an ADC having a capacitor array with a plurality of capacitors connected through a respective plurality of switches, a comparator, an SAR module, and a delay element circuit for ring oscillator and stall detection. The delay element circuit includes a delay block with a NAND gate followed by a plurality of inverters.

19 Claims, 6 Drawing Sheets

(56) References Cited

U.S. PATENT DOCUMENTS

| | | | |
|---|---|---|---|
| 2012/0256774 A1* | 10/2012 | Dey | H03M 1/109 |
| | | | 341/172 |
| 2012/0319883 A1* | 12/2012 | Cao | G04F 10/005 |
| | | | 341/155 |
| 2013/0088375 A1* | 4/2013 | Wu | H03M 1/1052 |
| | | | 341/120 |
| 2013/0135129 A1* | 5/2013 | Chang | G06F 3/041 |
| | | | 341/172 |
| 2013/0135134 A1* | 5/2013 | Lin | H03M 1/1215 |
| | | | 341/172 |
| 2013/0194118 A1* | 8/2013 | Coln | H03M 1/124 |
| | | | 341/155 |
| 2016/0241218 A1* | 8/2016 | Muneyasu | H03K 3/013 |
| 2017/0149440 A1* | 5/2017 | Lin | H03M 1/442 |

\* cited by examiner

DELAY ELEMENT CIRCUIT FOR RING OSCILLATOR AND STALL DETECTION UTILIZED IN SELF-CLOCKED SAR ADC

TECHNICAL FIELD

The present disclosure relates generally to analog-to-digital converters (ADCs) and, more particularly, to systems and methods for providing a ring oscillator and stall detection in a self-clocked successive-approximation-register (SAR) ADC such as in a wireless sensor node device.

BACKGROUND

In battery-connected sensor readout systems with very long lifetime, ultra-low power dissipation is important. To provide ultra-low power dissipation, the system clock needs to be low-frequency. This may align with the sampling interval of the sensor readout system, which is generally in the range of 10 to 100 milliseconds if not longer. This sets a lower clock frequency of 10 to 100 Hz.

The SAR ADC device architecture is a good choice when low power dissipation is of importance, and given the above, the system clock can initiate an ADC conversion by sampling its analog input voltage reflecting the sensor state. However, the SAR ADC needs a high-speed clock to do the required n number of comparisons to resolve a n-bit digital output word. This clock is often generated internally in the SAR ADC with a ring oscillator, where the comparator is included in the ring, together with a number of inverters. However, the ring oscillator does not inherently exhibit ultra-low power dissipation.

Moreover, one of the key building blocks in a SAR ADC is the comparator. A comparator takes time to execute a comparison, and as such, the comparator is, under some conditions, not able to make a decision in the available time. Further, in a self-clocking SAR ADC, where the comparator is included in the ring oscillator, the longer decision time of the comparator will only add time to the current clock period. However, in some cases the decision time is so long that the system requires a new sample before the ADC is finished resolving the previous one.

The present disclosure is directed to addressing one or more deficiencies and/or disadvantages, e.g., as set forth above or otherwise. However, it should be appreciated that the solution of any particular problem is not a limitation on the scope of this disclosure or of the attached claims except to the extent expressly noted. Moreover, this Background section reflects the inventors' thoughts and is not intended to accurately or completely reflect any particular prior art. As such, Applicants expressly disclaim this material as admitted prior art.

SUMMARY OF THE DISCLOSURE

In one aspect of the disclosed principles, a self-clocked SAR ADC sensor circuit includes an ADC having a capacitor array comprising a plurality of capacitors connected through a respective plurality of switches, a comparator, an SAR module and a delay element circuit for ring oscillator and stall detection. A controller is configured to execute a track phase when a sample clock signal CK_SMP is low by applying an input voltage VIN over all capacitors in the capacitor array of the ADC, execute a sampling phase on a subsequent rising edge of CK_SMP by opening the respective plurality of switches such that a sample of VIN is stored over the capacitor array of the ADC, and execute a comparison phase via the comparator, wherein the delay element circuit allows completion of each conversion prior to a new conversion being attempted and, when this is not possible, provides a notification that a stall has occurred.

In another embodiment, a delay element circuit for ring oscillator and stall detection is provided having a delay block with a NAND gate followed by a plurality of inverters, wherein a first of the plurality of inverters comprises a single input inverter, two or more others of the inverters are two-input inverters, and the last of the plurality of inverters comprises a single input inverter. The delay element circuit may further include a stall detect circuit having six two-input inverters.

In yet another embodiment, a self-clocked SAR ADC sensor circuit includes an ADC having a capacitor array comprising a plurality of capacitors connected through a respective plurality of switches, a comparator, an SAR module, and a delay element circuit for ring oscillator and stall detection, the delay element circuit comprising a delay block having a NAND gate followed by a plurality of inverters.

These and other aspects and features will be more readily understood when reading the following detailed description in conjunction with the accompanying drawings.

While the following detailed description is given with respect to certain illustrative embodiments, it is to be understood that such embodiments are not to be construed as limiting, but rather the present disclosure is entitled to a scope of protection consistent with all embodiments, modifications, alternative constructions, and equivalents thereto.

DETAILED DESCRIPTION

Before turning to a detailed discussion of the figures, a brief overview of certain disclosed features and principles will be given to aid the reader. As noted above, in battery-connected sensor readout systems with very long lifetime, ultra-low power dissipation is important. This requires a system clock that is low-frequency (about 10 to 100 Hz). However, an SAR ADC needs a high-speed clock to perform the required n number of comparisons to resolve an n-bit digital output word. This clock is often generated internally via a ring oscillator. However, the ring oscillator does not inherently exhibit ultra-low power dissipation. Moreover, the required comparator requires a delay to operate, and under some conditions, may not be able to finish a decision in the available time. In such cases, the system may require a new sample before the ADC has finished resolving the previous one.

For this reason, a circuit is needed that detects long decision time so that the system may take action on it. This circuit is called a stall detection circuit and, since it is activated on every comparator clocking, it must be implemented to consume an ultra-low power level.

Figure 1:
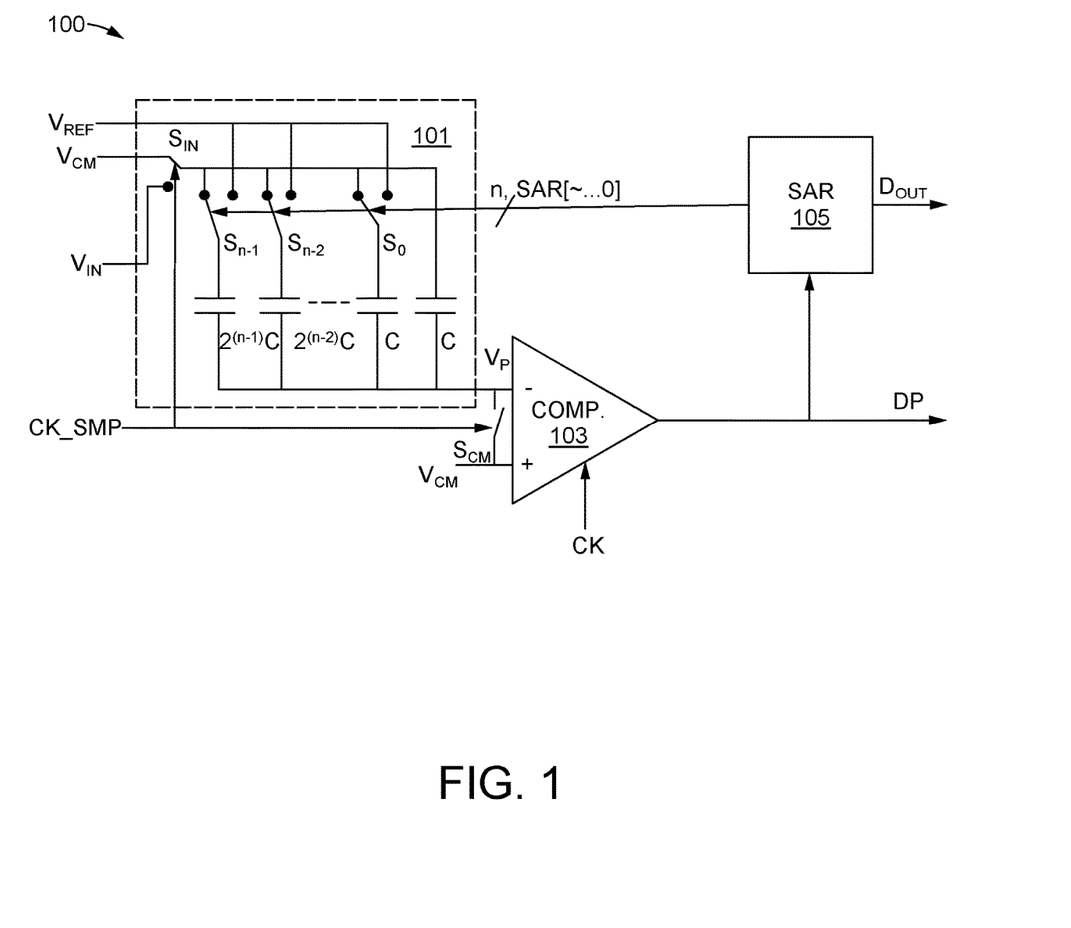
FIG. 1 is a schematic drawing of an implementation of an SAR ADC.

Referring to FIG. 1, this figure shows a simplified schematic representation of an SAR ADC. For simplicity the figure shows a single-ended system, while many implementations may be differential in order to resist noise in the circuit. While the illustrated circuit is a principal implementation of a SAR ADC, there exist a range of different implementations and the principles presented herein can be applied to any implementations where delay elements are required.

The illustrated circuit 100 includes a capacitive DAC 101, a comparator 103, and an SAR 105. The circuit modes of operation include a track phase, a sampling phase and a conversion phase. In the tracking phase, CK_SMP is low, $S_{IN}$ and $S_{CM}$ are closed (conducting) and the input voltage $V_{IN}$ is applied over all capacitors in the capacitor array of the DAC. In the sampling phase, on rising edge of CK_SMP, the switches $S_{IN}$ and $S_{CM}$ open, and a sample of $V_{IN}$ is stored over the capacitor array of the DAC.

In the conversion phase, a number of steps are executed. The SAR algorithm starts by connecting the MSB switch $S_{n-1}$ to $V_{REF}$ while the rest of the switches $S_{n-2}$-$S_0$ are connected to $V_{CM}$. This is done by setting the MSB bit of the SAR[ ]-bus to 1 and the rest of the bits to 0. The comparator COMP 103 is now clocked by the rising edge of CK_COMP and the voltage $V_P$ is compared to the common mode voltage $V_{CM}$. If $V_P > V_{CM}$ then DP is set to 1 and MSB in the SAR[ ]-bus is maintained 1. If $V_P < V_{CM}$ then DP is set to 0 and MSB in the SAR[ ]-bus is set to 0.

The MSB-1 bit in the SAR[ ]-bus is set and the procedure above is repeated until bit 0 of the SAR[ ]-bus is evaluated and set accordingly. The result is now made available at the ADC digital output $D_{out}$.

Figure 2:
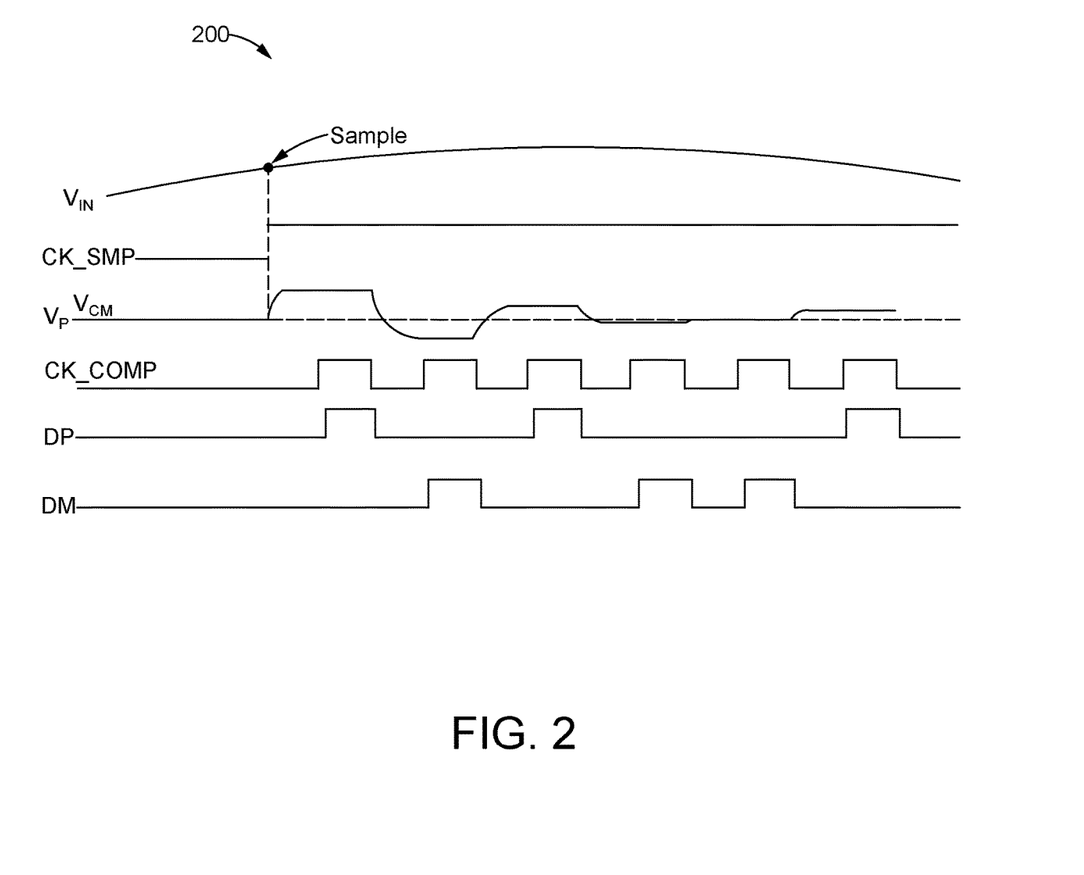
FIG. 2 is an indexed signal plot showing example signal values during operation of the SAR ADC of FIG. 1.

The indexed signal plot 200 of FIG. 2 shows the signal values in an example during the foregoing phases. In particular, this timing diagram shows that the input voltage $V_{IN}$ is sampled at the rising edge of CK_SMP. Further, the MSB of the SAR[ ]-bus is set and the COMP input voltage $V_p$ settles to its new value before the rising edge of CK_COMP and the comparison take place. Thus, the time CK_COMP is low is used for settling of $V_P$, and this sets the requirement to the frequency of CK_COMP, and further the amount of delay required in the delay chain in the ring oscillator generating CK_COMP.

Figure 3:
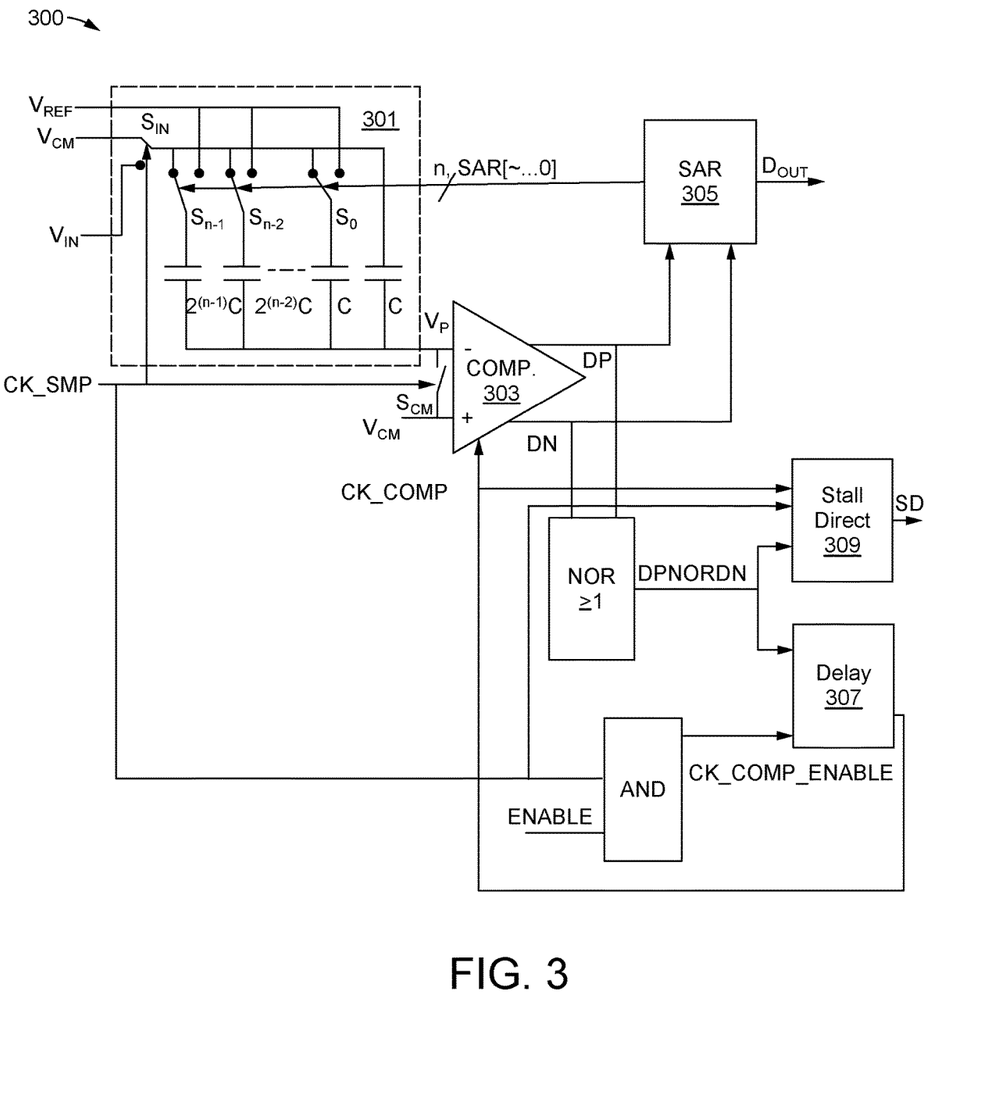
FIG. 3 is a schematic drawing of an implementation of an SAR ADC in accordance with an embodiment of the disclosed principles.

FIG. 3 is a simplified circuit schematic showing a delay chain implemented by a DELAY-block 307 and a stall detect circuit implemented in STALLDETECT 309. As with FIG. 1, the illustrated circuit 300 includes a capacitive DAC 301, a comparator 303, and an SAR 305. The circuit modes of operation include a track phase, a sampling phase and a conversion phase. In the tracking phase, CK_SMP is low, $S_{IN}$ and $S_{CM}$ are closed (conducting) and the input voltage $V_{IN}$ is applied over all capacitors in the capacitor array of the ADC 301. In the sampling phase, on rising edge of CK_SMP, switches $S_{IN}$ and $S_{CM}$ open, and a sample of $V_{IN}$, is stored over the capacitor array of the DAC.

After the rising edge of CK_COMP, a comparison is made by COMP 303 and one of DP and DN is set to 1. DPNORDN goes to 0 and the delay chain delays this negative edge to CK_COMP and reset COMP's output to 0. DPNORDN goes high again and this rising edge is delayed through DELAY 307 to CK_COMP, and a new comparison is started. The requirement to the amount of delay the DELAY-block is adding to its input clock edges is set by the settling requirement to $V_P$. In implementations where the sampling frequency (frequency of CK_SMP) is low, and the power dissipation requirement is ultra-low, the switches $S_{n-1} \ldots S_0$ and their drivers should be as small as possible, and the settling time of $V_P$, is therefore quite long compared to the delay of an inverter. Therefore, implementing DELAY 307 with a long chain of inverters, while possible, is not ideal due to the power dissipation this will incur.

Figure 4:
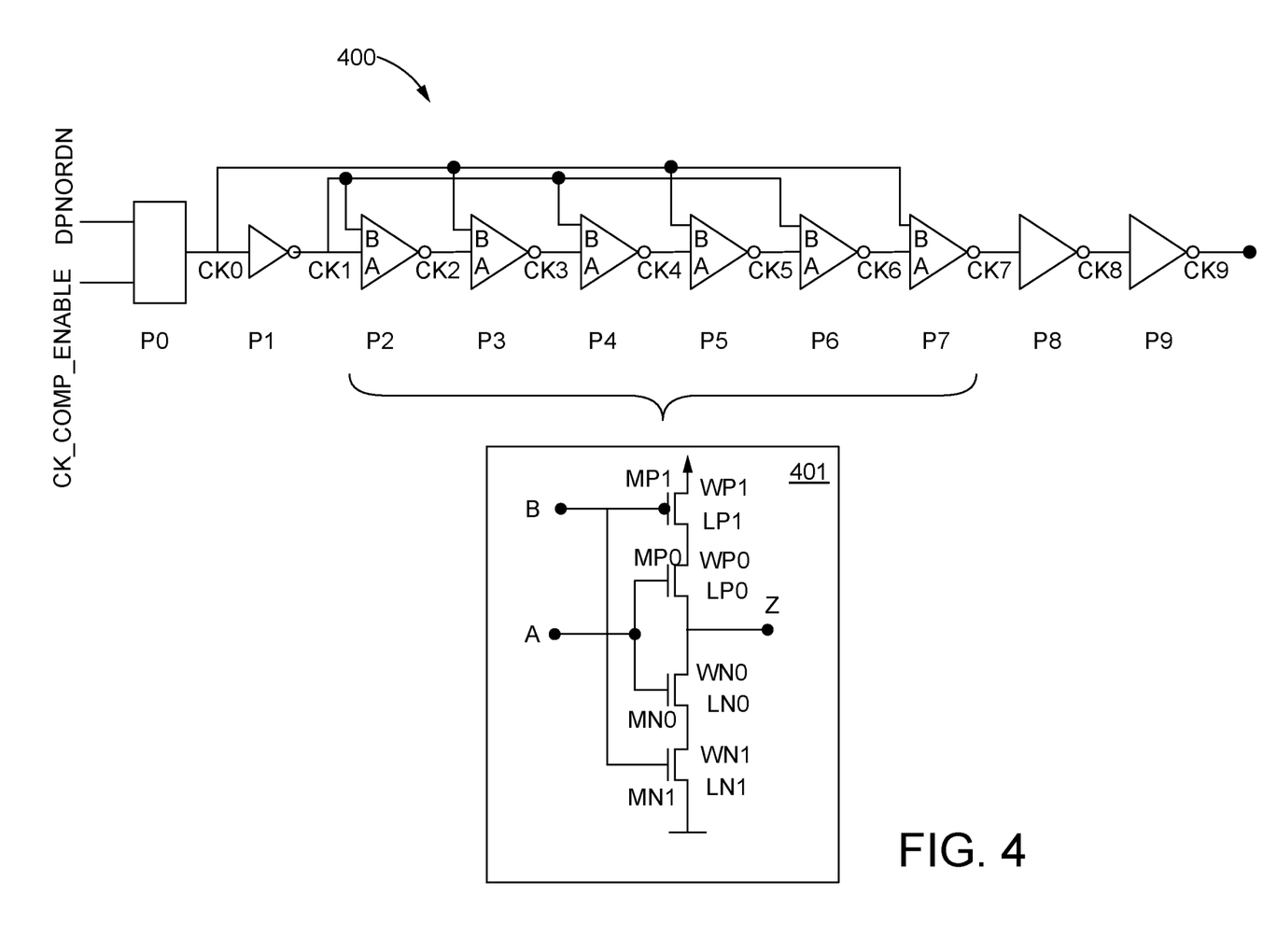
FIG. 4 is a schematic drawing of an implementation of an SAR ADC in accordance with an alternative embodiment of the disclosed principles.

FIG. 4 is a schematic circuit diagram showing an implementation of the DELAY-block 307 using a NAND gate (P0) at the input followed by 9 inverters (P1 to P9). The inverter P1 is a normal inverter built of two transistors. The inverters P2 to P7 are of the type shown in the inset 401. This inverter has two inputs. The input labelled "A" is the normal inverter input intended to drive the output to the opposite of A. The input labelled "B" is the second input and is intended to be driven by an earlier version of the signal at A. In operation, the rising clock edge is going through the inverter, first, B goes high to close MP1 and open MN1.

For ease of understanding, assume that an open transistor is a switch with low resistance, while a closed transistor is a switch with infinite resistance. When A goes up, MP0 closes, and MN0 opens. MN1 is already open, and Z goes down. Since MP1 is already closed when the edge arrives at A, no short current is drawn through the transistors from positive supply to ground. A normal inverter will draw a short current in the transition region of the P– and NMOS transistors (when they are both on). For long clock edges the voltage at A is in this transition region for a long time. The dissipation due to the short current becomes severe. The opposite holds if a negative clock edge is going through the inverter. Thus, the reason for MP1 and MN1 is to prevent short current flowing through the inverter when B is driven by an earlier clock edge than A.

As shown by the figure, the terminal B of the inverters P2 to P7 is driven by CK0 and CK1, which are early clocks and have steep clock edges. The main delay is made by the inverters P2 to P5. This is done by making the transistor lengths of MP0 and MN0 (LP0 and LN0) long. The delay will then be dependent on the RC time constant made by the on resistance of MP0 or MN0 and the capacitive loading due the next inverter. The delay can be adjusted by changing the number of such inverters in series, and/or changing the LP0 and LN0. Since the clock edges at outputs P2 to P5 are long, it is mandatory to short current flowing. The inverter P6 and P7 shapes the clock edges. These inverters LP0, LP1, LN0 and LN1 are made close to minimum, however input of these inverters experience slow clock edges, and it is necessary to prevent the short current flowing by using the inverter with two input terminals. When the clock edges are shaped, the inverter short current are much less than charge current into the inverter load. Therefore, normal inverters used (P8 and P9) for buffering.

In a further embodiment, certain additional features are provided. As discussed above with respect to the base configuration, the system includes a block and creates a ring oscillator. However, it is further contemplated to have the output of DELAY drive the clock input CK_COMP of the comparator COMP. The output DP and DN of COMP drives the input of NOR, and the output DPNORDN of NOR drives the input of DELAY. In this embodiment, the ENABLE input of DELAY is driven by CK_COMP_ENABLE, which again is set by the AND between CK_SMP and ENABLE.

Now assume that ENABLE is high: CK_SMP=0: CK_COMP_ENABLE=0, the ring oscillator is stopped by P0 in DELAY and CK_COMP is set to 0 and resets DP=DN=0. Now when CK_SMP goes to 1: CK_COMP_ENABLE goes to 1, DPNORDN=1, and the rings oscillator starts. The ring oscillator goes for n clock cycles equal to the number of the resolved bit in the digital output word $D_{out}$. When finished with the last bit (LSB), ENABLE goes to 0 and the ring oscillator is stopped.

Figure 5:
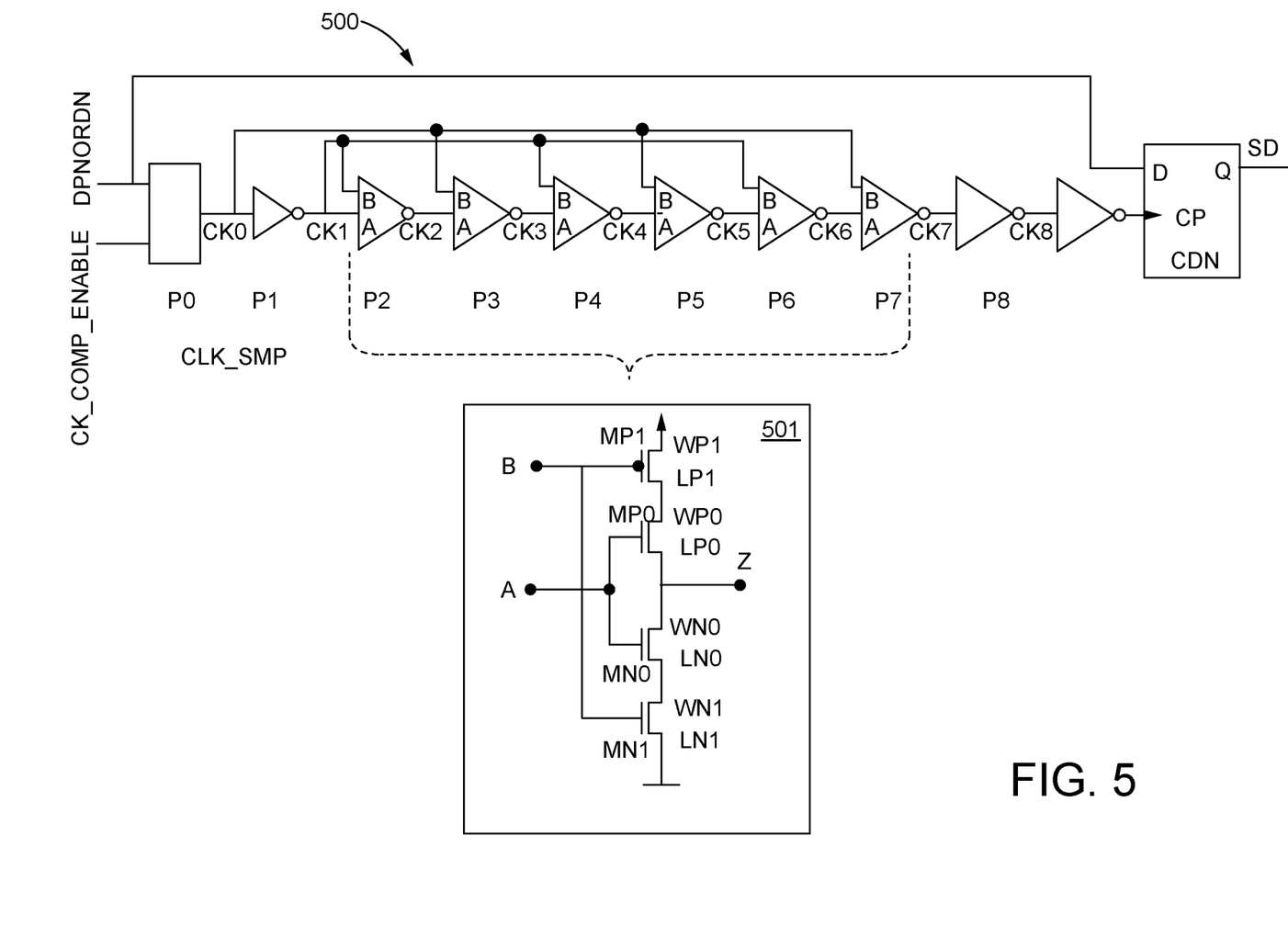
FIG. 5 is a schematic drawing of an implementation of a delay line in accordance with an embodiment of the disclosed principles.
Figure 6:
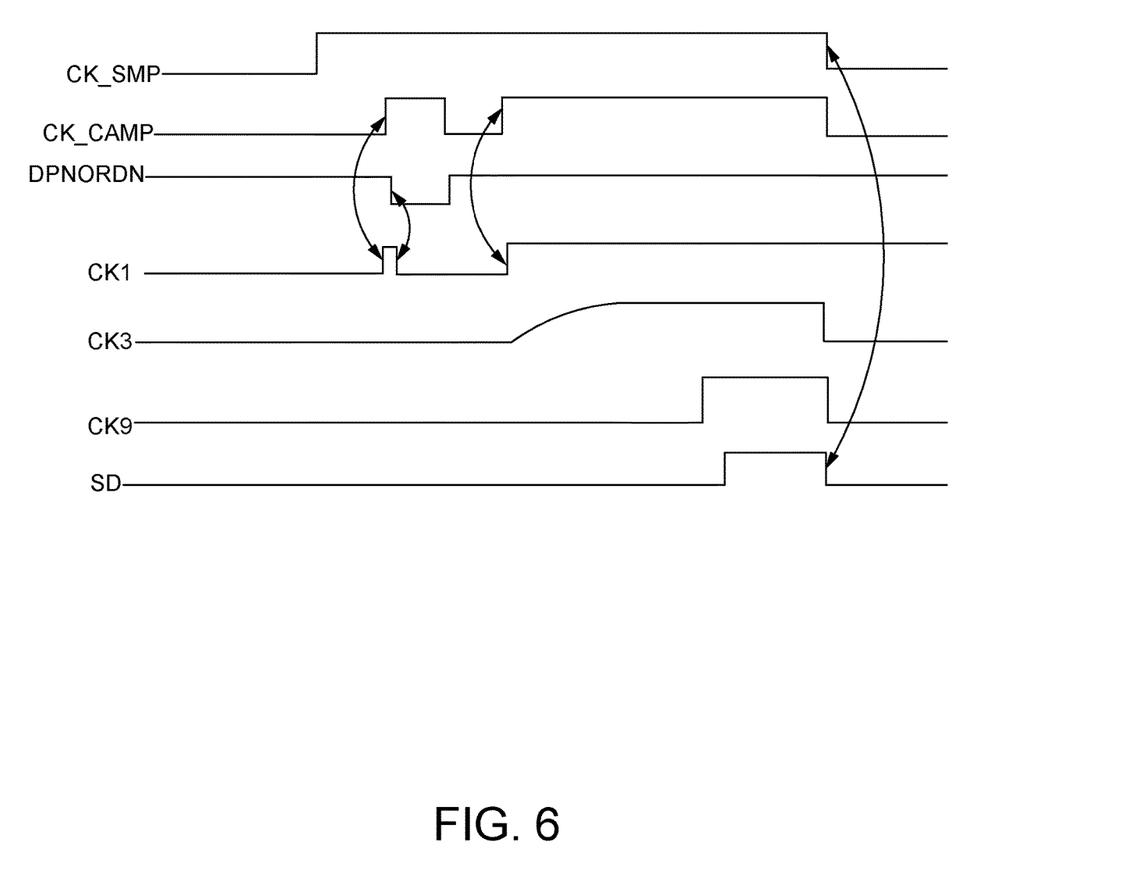
FIG. 6 is an indexed signal plot showing example signal values during operation of the delay line of FIG. 5.

In yet a further embodiment, the stall detect circuit (STALLDETECT-block in FIG. 3) is as shown in FIG. 5 (with signal timing shown in the plot 600 of FIG. 6). Under certain circumstances the comparator COMP is not able to make a decision when it is clocked. This may occur, for example, when the voltage difference between the input terminals are close to zero or when the common mode input voltage is very low or high (depending of the implementation of COMP). The illustrated stall detect circuit 500 employs a delay chain to detect if the comparator has not made a decision within the delay of the delay chain.

In this embodiment, the delay is made of a series of low power dissipation inverters, where P2 to P5 have long channel lengths LP0 and LN0, and P6 and P7 has short (close to minimum) LP0 and LN0 and reshapes the clock edges as shown in inset 501. The delay can be increased by increasing LP0 and LN0, and/or increasing the number of low power dissipation inverters with long LP0 and LN0. The mode of operation is as follows: first, assume that the NAND gate P0 is replaced with a normal inverter with input CK_COMP, and further CK_SMP=0 clear the flip-flop output SD to 0. The rising edge of CK_SMP starts the ring oscillator consisting of 303, 305 and 307 in 300, and the rising edge of CK_COMP arises after the delay of the ring oscillator.

The rising edge of CK_COMP will start to propagate through the ports P0 to P9 and clock the flip-flop. The value of DPNORDN will then be transferred from D to Q and set SD. If DPNORDN=1 at rising edge of CK9, no decision is made by the comparator and SD is set to 1. In this case, a stall is detected. However, if DPNORDN=0 at rising edge of CK9, decision is made by the comparator and SD is set to 0.

For a well-designed comparator, it is somewhat unusual for a decision not to be made, assuming that the input common mode voltage is in a safe range. The stall detect circuit runs at every clock edge of CK_COMP, n times resolved sample, and the flip-flop is clocked at every rising edge of CK9. The traditional stall detect circuit therefore dissipates a significant portion of the total ADC power dissipation. This is the reason for the NAND P0. In most cases DPNORDN goes low directly after CK_COMP goes high, as shown for the rising edge of CK_COMP in the timing diagram of FIG. 6. Due to the NAND-gate P0 in FIG. 5, the negative edge of DPNORDN resets the delay chain P0 to P9 before the rising edge of CK_COMP has travelled too far down in the chain of inverters.

To facilitate this, the inverters P2 to P5 must be made unsymmetrical: P2 and P4 have long LN0 and short LP0 such that CK2 and CK4 have long negative edges and short positive edges; P3 and P5 have long LP0 and short LN0 such that CK3 and CK5 have long positive edges and short negative edges.

As a result, DPNORDN=1 and rising edge of CK_COMP is delayed through the delay chain, CK_COMP=1 and falling edge of DPNORDN (decision made by comparator) does fast reset of the chain (the falling edge of DPNORDN travels much faster than the rising edge of CK_COMP does). In most cases the rising edge of CK_COMP has triggered only P2 before it is reset by falling edge of DPNORDN. This prevents most of the chain from toggling, and prevents the flip-flop from being clocked, which again reduces the power drawn by the stall detect circuit considerably.

In a further embodiment of the STALLDETECT-block, the STALLDETECT output SD is used to stop the ring oscillator by setting ENABLE=0 and CK_COMP_ENABLE=0. The clock CK_COMP is stopped, and does not restart even if a decision is made at a later time. The STALLDETECT output is further used to alert the system receiving output data from the ADC that the ADC is in stall such that further actions can be taken if necessary.

In yet a further embodiment, a pseudo random generator is included with an output bit B. When the output of the STALLDETECT-block SD is set to 1, the SAR bit under evaluation is set to B and the SAR algorithm is continued.

From the foregoing, it will be appreciated that while only certain embodiments have been set forth for the purposes of illustration, alternatives and modifications will be apparent from the above description to those skilled in the art. These and other alternatives are considered equivalents and within the spirit and scope of this disclosure and the appended claims.

What is claimed is:

1. A self-clocked SAR ADC sensor circuit for executing analog-to-digital conversion of a sensed value $V_{IN}$, the self-clocked SAR ADC sensor circuit comprising:
   an ADC having a capacitor array comprising a plurality of capacitors connected through a respective plurality of switches;
   a comparator;
   an SAR module;
   a delay element circuit for ring oscillator and stall detection; and
   a controller configured to execute a track phase when a sample clock signal CK_SMP is low by applying an input voltage VIN over all capacitors in the capacitor array of the ADC, execute a sampling phase on a subsequent rising edge of CK_SMP by opening a respective plurality of switches such that a sample of $V_{IN}$ is stored over the capacitor array of the ADC, and execute a comparison phase via the comparator, wherein the delay element circuit allows completion of each conversion prior to a new conversion being attempted and, when the completion is not possible, provides a notification that a stall has occurred.

2. The self-clocked SAR ADC sensor circuit in accordance with claim 1, wherein the self-clocked SAR ADC sensor circuit is an ultra-low power dissipation circuit.

3. The self-clocked SAR ADC sensor circuit in accordance with claim 1, wherein a clock, of the self-clocked SAR ADC sensor circuit, runs at between 10 Hz and 100 Hz.

4. The self-clocked SAR ADC sensor circuit in accordance with claim 1, wherein the delay element circuit comprises a delay block having a NAND gate followed by a plurality of inverters.

5. The self-clocked SAR ADC sensor circuit in accordance with claim 4, wherein a first of the plurality of inverters comprises two transistors.

6. The self-clocked SAR ADC sensor circuit in accordance with claim 5, wherein two or more others of the plurality of inverters are two-input inverters.

7. The self-clocked SAR ADC sensor circuit in accordance with claim 6, wherein the two or more others of the plurality of inverters each comprises four transistors.

8. The self-clocked SAR ADC sensor circuit in accordance with claim 7, wherein a last of the plurality of inverters comprises two transistors.

9. A delay element circuit for ring oscillator and stall detection comprising:
 a delay block having a NAND gate followed by a plurality of inverters, wherein a first of the plurality of inverters comprises a single input inverter, two or more others of the plurality of inverters are two-input inverters, and a last of the plurality of inverters comprises a single input inverter; and
 a stall detect circuit.

10. The delay element circuit in accordance with claim 9, wherein the two or more others of the inverters each comprise four transistors.

11. The delay element circuit in accordance with claim 9, wherein the first and last of the plurality of inverters comprise two transistors.

12. The delay element circuit in accordance with claim 9, wherein the stall detect circuit comprises six two-input inverters.

13. The delay element circuit in accordance with claim 12, wherein the delay element circuit is linked to an SAR ADC, and wherein the delay element circuit is configured such that the delay element circuit outputs a stall detection alert if a comparator of the SAR ADC has not converted a current sample prior to a time that a subsequent sample is received.

14. A self-clocked SAR ADC sensor circuit for executing analog-to-digital conversion of a sensed value $V_{IN}$, the self clocked SAR ADC sensor circuit comprising:
 an ADC having a capacitor array comprising a plurality of capacitors connected through a respective plurality of switches;
 a comparator;
 an SAR module; and
 a delay element circuit for ring oscillator and stall detection, the delay element circuit for the ring oscillator and stall detection comprising a delay block having a NAND gate followed by a plurality of inverters.

15. The self-clocked SAR ADC sensor circuit in accordance with claim 14, wherein a first of the plurality of inverters comprises a single input inverter, two or more others of the plurality of inverters are two-input inverters, and a last of the plurality of inverters comprises a single input inverter.

16. The self-clocked SAR ADC sensor circuit in accordance with claim 15, wherein the two or more others of the inverters each comprises four transistors.

17. The self-clocked SAR ADC sensor circuit in accordance with claim 14, wherein the first and last of the plurality of inverters comprise two transistors.

18. The self-clocked SAR ADC sensor circuit in accordance with claim 14, further comprising a stall detect circuit having at least six two-input inverters.

19. The self-clocked SAR ADC sensor circuit in accordance with claim 18, wherein the stall detect circuit is configured to output a stall detection alert if the comparator has not converted a current sample prior to a time that a subsequent sample is received.

* * * * *